(12) United States Patent
Tai et al.

(10) Patent No.: US 11,011,501 B2
(45) Date of Patent: May 18, 2021

(54) PACKAGE STRUCTURE, PACKAGE-ON-PACKAGE STRUCTURE AND METHOD OF FABRICATING THE SAME

(71) Applicant: Taiwan Semiconductor Manufacturing Co., Ltd., Hsinchu (TW)

(72) Inventors: Chih-Hsuan Tai, Taipei (TW); Hao-Yi Tsai, Hsinchu (TW); Yu-Chih Huang, Hsinchu (TW); Chia-Hung Liu, Hsinchu (TW); Ting-Ting Kuo, Hsinchu (TW); Ban-Li Wu, Hsinchu (TW); Ying-Cheng Tseng, Tainan (TW); Chi-Hui Lai, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/103,921

(22) Filed: Aug. 14, 2018

(65) Prior Publication Data

US 2020/0058626 A1    Feb. 20, 2020

(51) Int. Cl.
*H01L 23/498* (2006.01)
*H01L 25/10* (2006.01)
(Continued)

(52) U.S. Cl.
CPC .......... *H01L 25/105* (2013.01); *H01L 21/486* (2013.01); *H01L 21/4853* (2013.01); *H01L 21/4857* (2013.01); *H01L 21/568* (2013.01); *H01L 23/3128* (2013.01); *H01L 23/49816* (2013.01); *H01L 23/49822* (2013.01); *H01L 23/49827* (2013.01); *H01L 25/50* (2013.01); *H01L 24/16* (2013.01); *H01L 24/48* (2013.01); *H01L 2224/16227* (2013.01); *H01L 2224/48227* (2013.01); *H01L 2225/1058* (2013.01)

(58) Field of Classification Search
CPC ............................ H01L 23/5389; H01L 24/32
See application file for complete search history.

(56) References Cited

U.S. PATENT DOCUMENTS 9,000,584 B2    4/2015  Lin et al.
9,048,222 B2    6/2015  Hung et al.
(Continued)

*Primary Examiner* — Moazzam Hossain
*Assistant Examiner* — Hajar Kolahdouzan
(74) *Attorney, Agent, or Firm* — JCIPRNET

(57) ABSTRACT

A package structure including a first redistribution layer, a semiconductor die, through insulator vias, an insulating encapsulant and a second redistribution layer. The first redistribution layer includes a dielectric layer, a conductive layer, and connecting portions electrically connected to the conductive layer. The dielectric layer has first and second surfaces, the connecting portions has a first side, a second side, and sidewalls joining the first side to the second side. The first side of the connecting portions is exposed from and coplanar with the first surface of the dielectric layer. The semiconductor die is disposed on the second surface of the dielectric layer. The through insulator vias are connected to the conductive layer. The insulating encapsulant is disposed on the dielectric layer and encapsulating the semiconductor die and the through insulator vias. The second redistribution layer is disposed on the semiconductor die and over the insulating encapsulant.

20 Claims, 13 Drawing Sheets

(51) Int. Cl.

| | | |
|---|---|---|
| | *H01L 23/31* | (2006.01) |
| | *H01L 25/00* | (2006.01) |
| | *H01L 21/48* | (2006.01) |
| | *H01L 21/56* | (2006.01) |
| | *H01L 23/00* | (2006.01) |

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2016/0093572 A1* | 3/2016 | Chen .................. H01L 21/486 257/774 |
| 2017/0271289 A1* | 9/2017 | Keser ................ H01L 23/3135 |

\* cited by examiner

PACKAGE STRUCTURE, PACKAGE-ON-PACKAGE STRUCTURE AND METHOD OF FABRICATING THE SAME

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
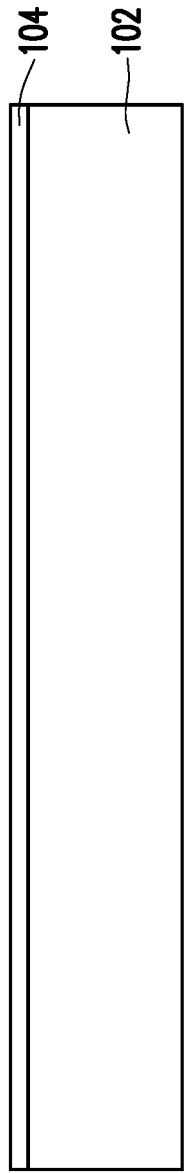
FIG. 1A to FIG. 1I are schematic cross-sectional views of various stages in a manufacturing method of a package-on-package (PoP) structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are schematic cross-sectional views of various stages in a manufacturing method of a package-on-package (PoP) structure according to some exemplary embodiments of the present disclosure. Referring to FIG. 1A, a carrier 102 with a de-bonding layer 104 coated thereon is provided. In some embodiments, the carrier 102 may be a glass carrier or any suitable carrier for carrying a semiconductor wafer or a reconstituted wafer used for the manufacturing method of the package-on-package structure. In some embodiments, the de-bonding layer 104 may be any material suitable for bonding and de-bonding the carrier 102 from the above layer(s) or any wafer(s) disposed thereon.

In some embodiments, the de-bonding layer 104 may include a dielectric material layer made of a dielectric material including any suitable polymer-based dielectric material (such as benzocyclobutene ("BCB"), polybenzoxazole ("PBO")). In an alternative embodiment, the de-bonding layer 104 may include a dielectric material layer made of an epoxy-based thermal-release material, which loses its adhesive property when heated, such as a light-to-heat-conversion (LTHC) release coating film. In a further alternative embodiment, the de-bonding layer 104 may include a dielectric material layer made of an ultra-violet (UV) glue, which loses its adhesive property when exposed to UV lights. In certain embodiments, the de-bonding layer 104 may be dispensed as a liquid and cured, or may be a laminate film laminated onto the carrier 102. In certain embodiments, the de-bonding layer 104 is, for example, a LTHC layer with good chemical resistance, and such layer enables room temperature de-bonding from the carrier 102 by applying laser irradiation.

Figure 1B:
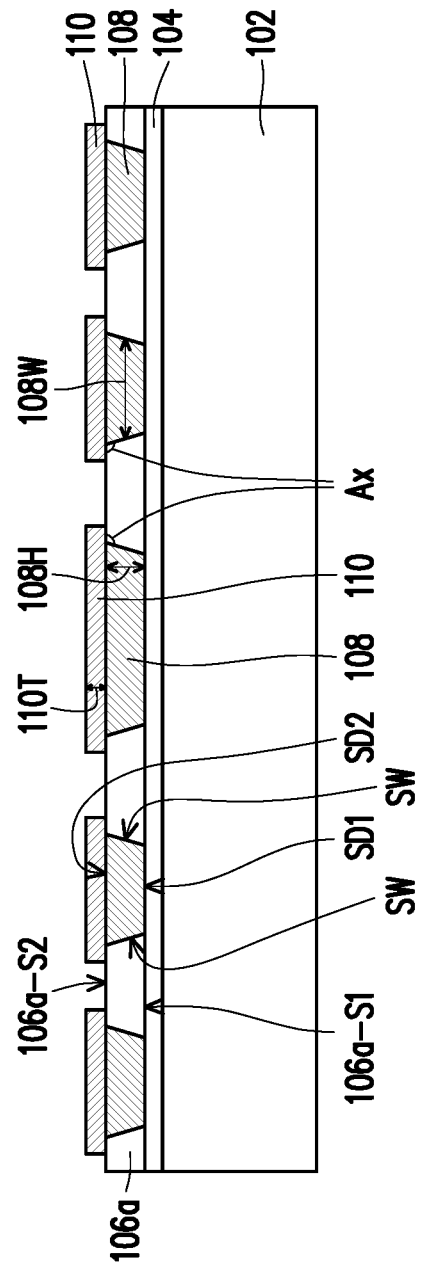

Referring to FIG. 1B, after providing the carrier 102 and the de-bonding layer 104, the steps of forming a first redistribution layer is performed. As illustrated in FIG. 1B, a first dielectric layer 106a is formed on the de-bonding layer 104. In some embodiments, the first dielectric layer 106a is patterned to form openings (not shown), wherein a plurality of connecting portions 108 is formed in the openings, and a conductive layer 110 is formed over the first dielectric layer 106a and the connecting portions 108. In some embodiments, the connecting portions 108 are embedded in the first dielectric layer 106a and the conductive layer 110 may be connected to the connecting portions 108. In certain embodiments, the connecting portions 108 and the conductive layer 110 are formed in the same steps. However, the disclosure is not limited thereto. In other embodiments, the connecting portions 108 and the conductive layer 110 may be formed in different steps. For example, the connecting portions 108 may first be formed on the de-bonding layer 104, while the first dielectric layer 106a and the conductive layer 110 may be formed thereafter. In some embodiments, the connecting portions 108 and the conductive layer 110 are formed of metallic materials including aluminum, titanium, copper, nickel, tungsten, and/or alloys thereof, and the connecting portions 108 and conductive layer 110 may be formed by electroplating or deposition. The disclosure is not limited thereto.

In the illustrated embodiment, the first dielectric layer 106a has a first surface 106a-S1 and a second surface 106a-S2 opposite to the first surface 106a-S1. Furthermore, in some embodiments, the connecting portions 108 has a first side SD1 and a second side SD2 and sidewalls SW joining the first side SD1 to the second side SD2. As shown in FIG. 1B, the first side SD1 of the connecting portions 108 are exposed from and coplanar with the first surface 106a-S1 of the first dielectric layer 106a, and the second side SD2 of the connecting portions 108 are connected to the conductive layer 110. In other words, the first side SD1 of the connecting portions 108 are flat surfaces that are coplanar with the first surface 106a-S1 of the first dielectric layer 106a, while the second side SD2 of the connecting portions 108 are also flat surfaces that are joined with a surface of the conductive layer 110.

In addition, as shown in FIG. 1B, in some embodiments, a width 108W of the plurality of connecting portions 108 decreases from the first side SD1 to the second side SD2. In other words, an angle Ax of the sidewalls SW relative to the conductive layer 110 is greater than 90°. However, the disclosure is not limited thereto, and the design of the connecting portions 108 may be adjusted based on product requirement. In some embodiments, a thickness 110T of the conductive layer 110 and a height 108H of the connecting portions 108 sums up to a range of 2 μm to 50 μm. In certain embodiments, the thickness 110T of the conductive layer 110 and the height 108H of the connecting portions 108 sums up to a range of 14 μm to 35 μm. By increasing the thickness and height of the conductive layer 110 and the connecting portions 108 to this range (14 μm to 35 μm), a heat dissipation of the package structure can be improved. In some alternative embodiments, the thickness and height of the conductive layer 110 and the connecting portions 108 may further be adjusted to have a sum of more than 50 μm for use in other applications.

Figure 1C:
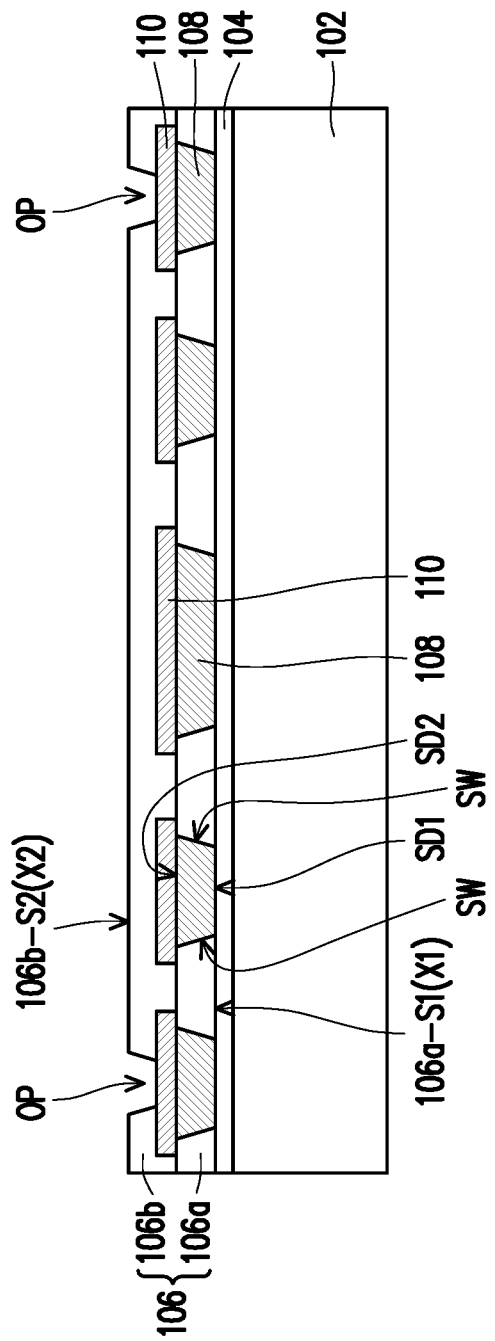

Referring to FIG. 1C, after forming the connecting portions 108 and the conductive layer 110, a second dielectric layer 106b is formed on the first dielectric layer 106a and covering the conductive layer 110. In some embodiments, the first dielectric layer 106a and the second dielectric layer 106b may constitute a dielectric layer of the first redistribution layer 106. In certain embodiments, the second dielectric layer 106b may have a second surface 106b-S2 (or second surface X2 of the dielectric layer) that is opposite to the first surface 106a-S1 (or first surface X1 of the dielectric layer) of the first dielectric layer 106a. In the exemplary embodiment, the first dielectric layer 106a and the second dielectric layer 106b may be made of non-organic or organic dielectric materials such as silicon oxide, silicon nitride, silicon carbide, silicon oxynitride, polyimide, benzocyclobutene (BCB), polybenzoxazole (PBO), or any other suitable polymer-based dielectric materials, but the disclosure is not limited thereto. In some embodiments, the first dielectric layer 106a and the second dielectric layer 106b may be formed by deposition. The disclosure is not limited thereto. After forming the second dielectric layer 106, the second surface 106b-S2 of the second dielectric layer 106b may be patterned to form openings OP that expose portions of the conductive layer 110, allowing for further connection.

Figure 1D:
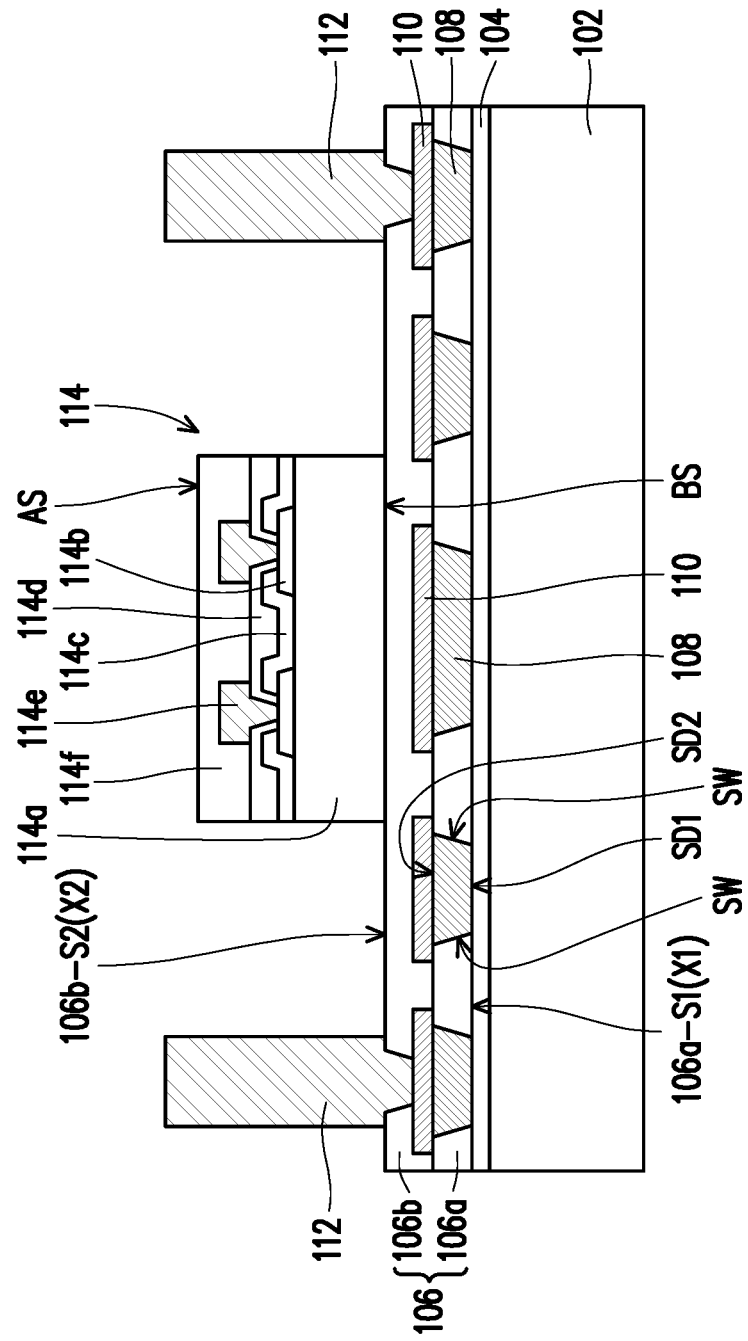

Referring to FIG. 1D, in a next step, a plurality of through insulator vias 112 is formed on the first redistribution layer 106 filling in the openings OP, and a semiconductor die 114 is disposed on the first redistribution layer 106. In some embodiments, the through insulator vias 112 are through integrated fan-out ("InFO") vias. In one embodiment, the formation of the through insulator vias 112 includes forming a mask pattern (not shown) with openings, then forming a metallic material (not shown) filling up the openings by electroplating or deposition, and removing the mask pattern to form the through insulator vias 112 on the first redistribution layer 106. The material of the mask pattern may include a positive photo-resist or a negative photo-resist. In one embodiment, the material of the through insulator vias 112 may include a metal material such as copper or copper alloys, or the like. However, the disclosure is not limited thereto.

In an alternative embodiment, the through insulator vias 112 may be formed by forming a seed layer (not shown) on the first redistribution layer 106; forming the mask pattern with openings exposing portions of the seed layer; forming the metallic material on the exposed portions of the seed layer to form the through insulator vias 112 by plating; removing the mask pattern; and then removing portions of the seed layer exposed by the through insulator vias 112. For example, the seed layer may be a titanium/copper composited layer. For simplification, only two through insulator vias 112 are illustrated in FIG. 1D. However, it should be noted that the number of through insulator vias 112 is not limited thereto, and can be selected based on requirement.

As illustrated in FIG. 1D, one or more semiconductor dies 114 may be picked and placed on the first redistribution layer 106. In certain embodiments, the semiconductor die 114 has an active surface AS, and a backside surface BS opposite to the active surface AS. For example, the backside surface BS of the semiconductor die 114 may be attached to the first redistribution layer 106 through a die attach film (not shown). By using the die attach film, a better adhesion between the semiconductor dies 106 and the first redistribution layer 106 is ensured. In the exemplary embodiment, only one semiconductor die 114 is illustrated. However, the disclosure is not limited thereto. In other embodiments, the number of semiconductor dies disposed on the first redistribution layer 106 may be adjusted based on product requirement.

In the exemplary embodiment, the semiconductor die 114 includes a semiconductor substrate 114a, a plurality of conductive pads 114b, a passivation layer 114c, a post passivation layer 114d, a plurality of conductive posts or conductive vias 114e, and a protection layer 114f. As illustrated in FIG. 1D, the plurality of conductive pads 114b is disposed on the semiconductor substrate 114a. The passivation layer 114c is formed over the semiconductor substrate 114a and has openings that partially expose the conductive pads 114b on the semiconductor substrate 114a. The semiconductor substrate 114a may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 114b may be aluminum pads, copper pads or other suitable metal pads. The passivation layer 114c may be a silicon oxide layer, a silicon nitride layer, a silicon oxy-nitride layer or a dielectric layer formed of any suitable dielectric materials. Furthermore, in some embodiments, the post-passivation layer 114d is optionally formed over the passivation layer 114c. The post-passivation layer 114d covers the passivation layer 114c and has a plurality of contact openings. The conductive pads 114b are partially exposed by the contact openings of the post passivation layer 114d. The post-passivation layer 114d may be a benzocyclobutene (BCB) layer, a polyimide layer, a polybenzoxazole (PBO) layer, or a dielectric layer formed by other suitable polymers. In some embodiments, the conductive posts or conductive vias 114e are formed on the conductive pads 114b by plating. In some embodiments, the protection layer 114f is formed on the post passivation layer 114d covering the conductive posts or conductive vias 114e so as to protect the conductive posts or conductive vias 114e.

In some embodiments, when more than one semiconductor dies 114 are placed on the first redistribution layer 106, the semiconductor dies 114 may be arranged in an array, and when the semiconductor dies 114 are arranged in an array, the through insulator vias 112 may be classified into groups. The number of the semiconductor dies 114 may correspond to the number of the groups of the through insulator vias 112. In the illustrated embodiment, the semiconductor dies 114 may be picked and placed on the first redistribution layer 106 after the formation of the through insulator vias 112. However, the disclosure is not limited thereto. In some alternative embodiments, the semiconductor dies 114 may be picked and placed on the first redistribution layer 106 before the formation of the through insulator vias 112.

In some embodiments, the semiconductor die 114 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 1E:
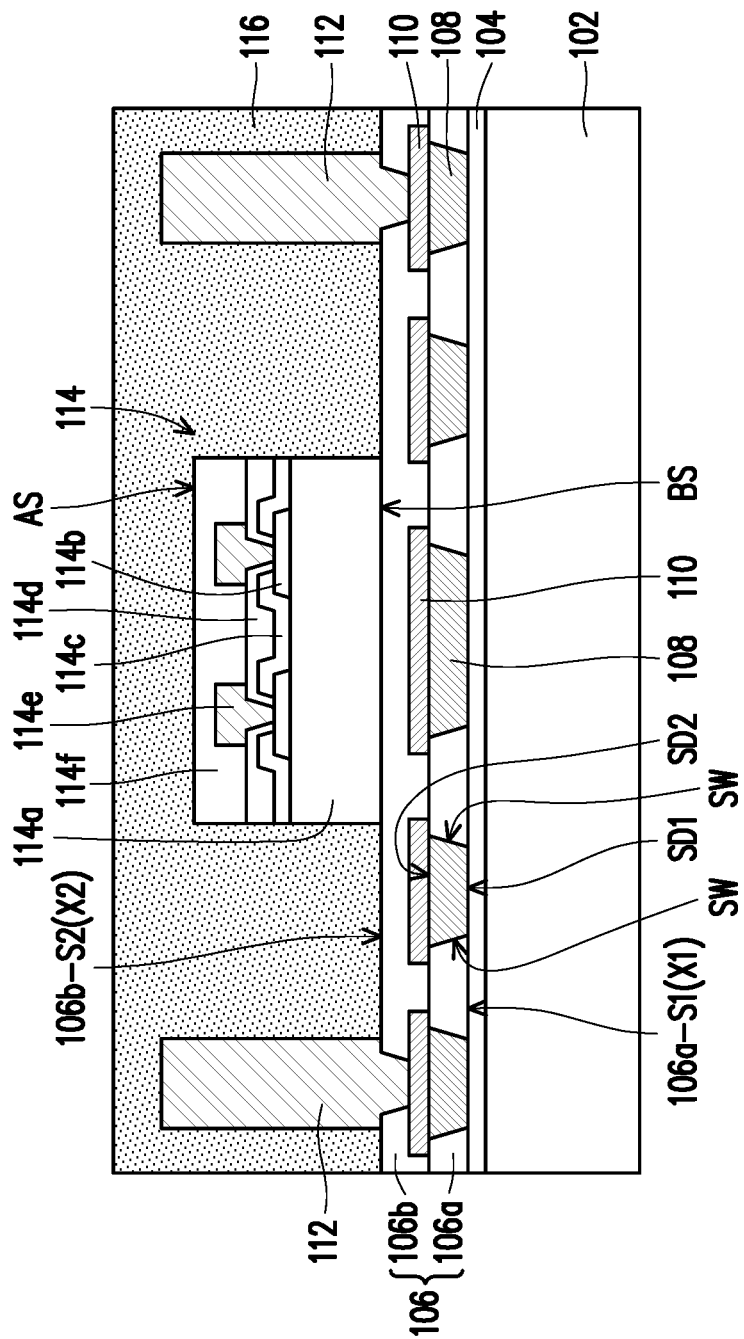

Referring to FIG. 1E, an insulating material 116 is formed on the first redistribution layer 106 and over the semiconductor die 114. In some embodiments, the insulating material 116 is formed through, for example, a compression molding process, filling up the gaps between the semiconductor die 114 and the through insulating vias 112 to encapsulate the semiconductor die 114. The insulating material 116 also fills up the gaps between adjacent through insulator vias 112 to encapsulate the through insulator vias 112. The conductive posts or conductive vias 114e and the protection layer 114f of the semiconductor dies 114 are encapsulated by and well protected by the insulating material 116. In other words, the conductive posts or conductive vias 114e and the protection layer 114f of the semiconductor dies 114 are not revealed and are well protected by the insulating material 116.

In some embodiments, the insulating material 116 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 116 may include an acceptable insulating encapsulation material. In some embodiments, the insulating material 116 may further include inorganic filler or inorganic compound (e.g. silica, clay, and so on) which can be added therein to optimize coefficient of thermal expansion (CTE) of the insulating material 116. The disclosure is not limited thereto.

Figure 1F:
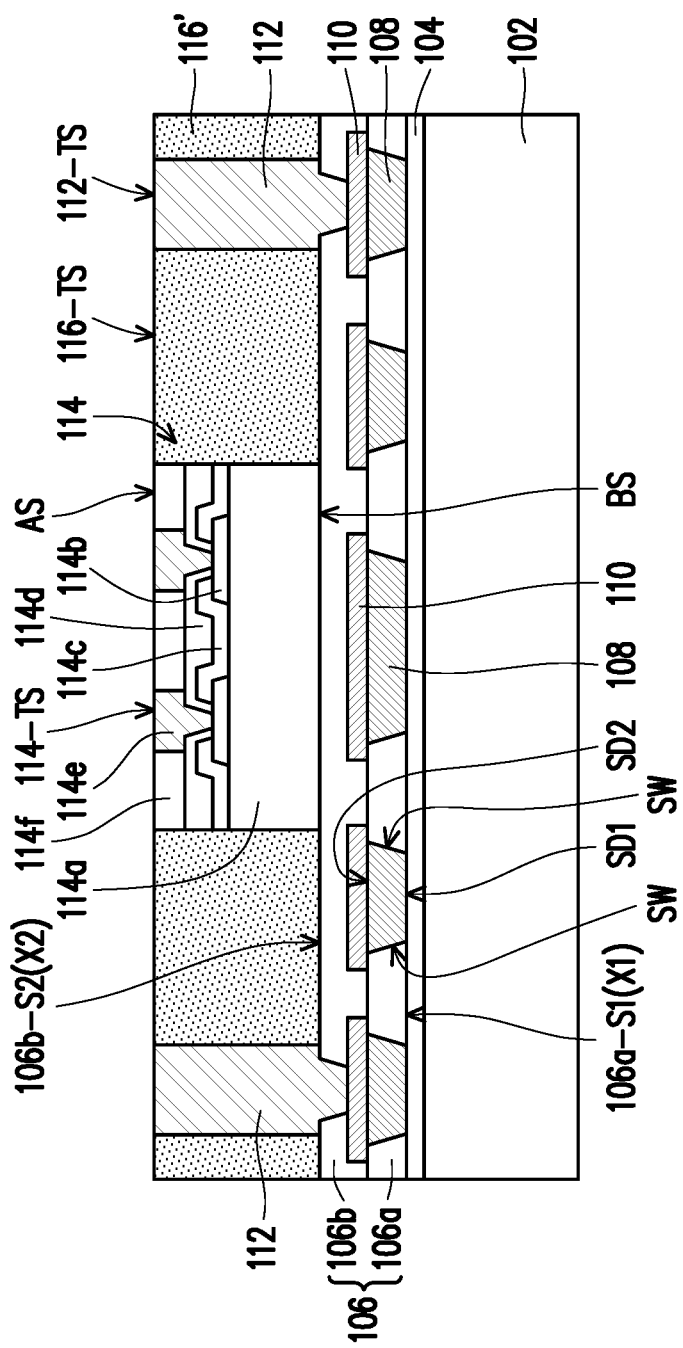

Referring to FIG. 1F, in some embodiments, the insulating material 116 is partially removed to expose the conductive posts 114e and the through insulator vias 112. In some embodiments, the insulating material 116 and the protection layer 114f are ground or polished by a planarization step. For example, the planarization step is performed through a mechanical grinding process and/or a chemical mechanical polishing (CMP) process until the top surfaces 114-TS (or active surface AS) of the conductive posts 114e are revealed. In some embodiments, the through insulator vias 112 may be partially polished so that the top surfaces 112-TS of the through insulator vias 112 are levelled with the top surfaces 114-TS of the conductive posts 114e, or levelled with the active surface AS of the semiconductor dies 114. In other words, the conductive posts 114e and the through insulator vias 112 may also be slightly grinded/polished.

In the illustrated embodiment, the insulating material 116 is polished to form an insulating encapsulant 116'. In some embodiments, the top surface 116-TS of the insulating encapsulant 116', the top surface 112-TS of the through insulator vias 112, the top surface 114-TS of the conductive posts 114e, and the top surface of the polished protection layer 114f are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 1G:
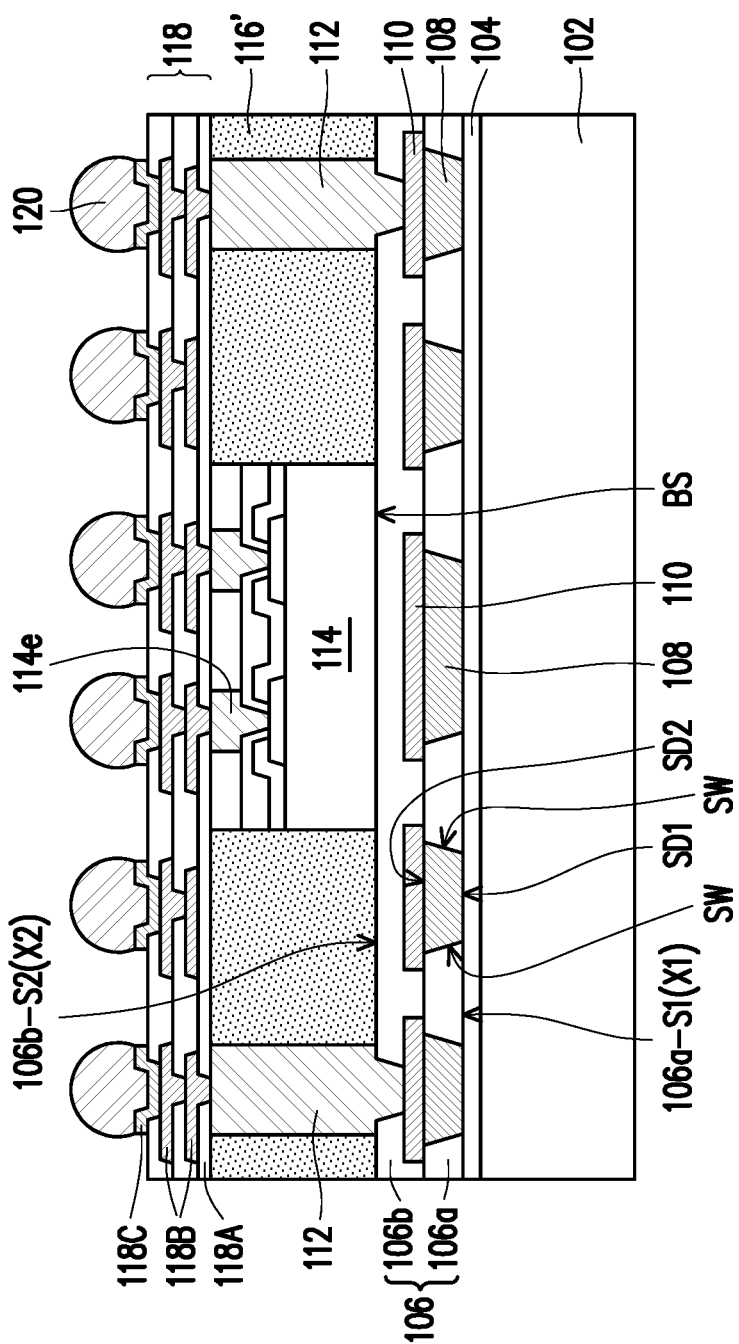

Referring to FIG. 1G, after the planarization step, a second redistribution layer 118 is formed on the insulating encapsulant 116', the through insulator vias 112 and the semiconductor die 114. As illustrated in FIG. 1G, the second redistribution layer 118 is formed on the top surface 112-TS of the through insulator vias 112, on the top surfaces 114-TS of the conductive posts 114e, and on the top surface 116-TS of the insulating encapsulant 116'. In some embodiments, the second redistribution layer 118 is electrically connected to the through insulator vias 112, and is electrically connected to the semiconductor die 114 through the conductive posts 114e. In some embodiments, the semiconductor die 114 is electrically connected to the through insulator vias 112 through the second redistribution layer 118.

In some embodiments, the formation of the second redistribution layer 118 includes sequentially forming one or more dielectric layers 118A, and one or more metallization layers 118B in alternation. In certain embodiments, the metallization layers 118B are sandwiched between the dielectric layers 118A. Although only two layers of the metallization layers 118B and three layers of dielectric layers 118A are illustrated herein, however, the scope of the disclose is not limited by the embodiments of the disclosure. In other embodiments, the number of metallization layers 118B and the dielectric layers 118A may be adjusted based on product requirement. In some embodiments, the metallization layers 118B are electrically connected to the conductive posts 114e of the semiconductor die 114. Furthermore, the metallization layers 118B are electrically connected to the through insulator vias 112.

In certain embodiments, the material of the dielectric layers 118A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 118A are formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 118B may be made of conductive materials formed by electroplating or deposition, such as aluminum, titanium, copper, nickel, tungsten, and/or alloys thereof, which may be patterned using a photolithography and etching process. In some embodiments, the metallization layer 118B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After forming the second redistribution layer 118, a plurality of conductive pads 118C may be disposed on an exposed top surface of the topmost layer of the metallization layers 118B for electrically connecting with conductive balls. In certain embodiments, the conductive pads 118C are for example, under-ball metallurgy (UBM) patterns used for ball mount. As shown in FIG. 1G, the conductive pads 118C are formed on and electrically connected to the second redistribution layer 118. In some embodiments, the materials of the conductive pads 118C may include copper, nickel, titanium, tungsten, or alloys thereof or the like, and may be formed by an electroplating process, for example. The number of conductive pads 118C are not limited in this disclosure, and may be selected based on the design layout. In some alternative embodiments, the conductive pads 118C may be omitted. In other words, conductive balls 120 formed in subsequent steps may be directly disposed on the second redistribution layer 118.

Referring still to FIG. 1G, after forming the conductive pads 118C, a plurality of conductive balls 120 is disposed on the conductive pads 118C and over the second redistribution layer 118. In some embodiments, the conductive balls 120 may be disposed on the conductive pads 118C by a ball placement process or reflow process. In some embodiments, the conductive balls 120 are, for example, solder balls or ball grid array (BGA) balls. In some embodiments, the conductive balls 120 are connected to the second redistribution layer 118 through the conductive pads 118C. In certain embodiments, some of the conductive balls 120 may be electrically connected to the semiconductor die 114 through the second redistribution layer 118. Furthermore, some of the conductive balls 120 may be electrically connected to the through insulator vias 112 through the second redistribution layer 118. The number of the conductive balls 120 is not limited to the disclosure, and may be designated and selected based on the number of the conductive pads 118C. In some alternative embodiments, an integrated passive device (IPD) (not shown) may optionally be disposed on the second redistribution layer 118 and electrically connected to the second redistribution layer 118.

Figure 1H:
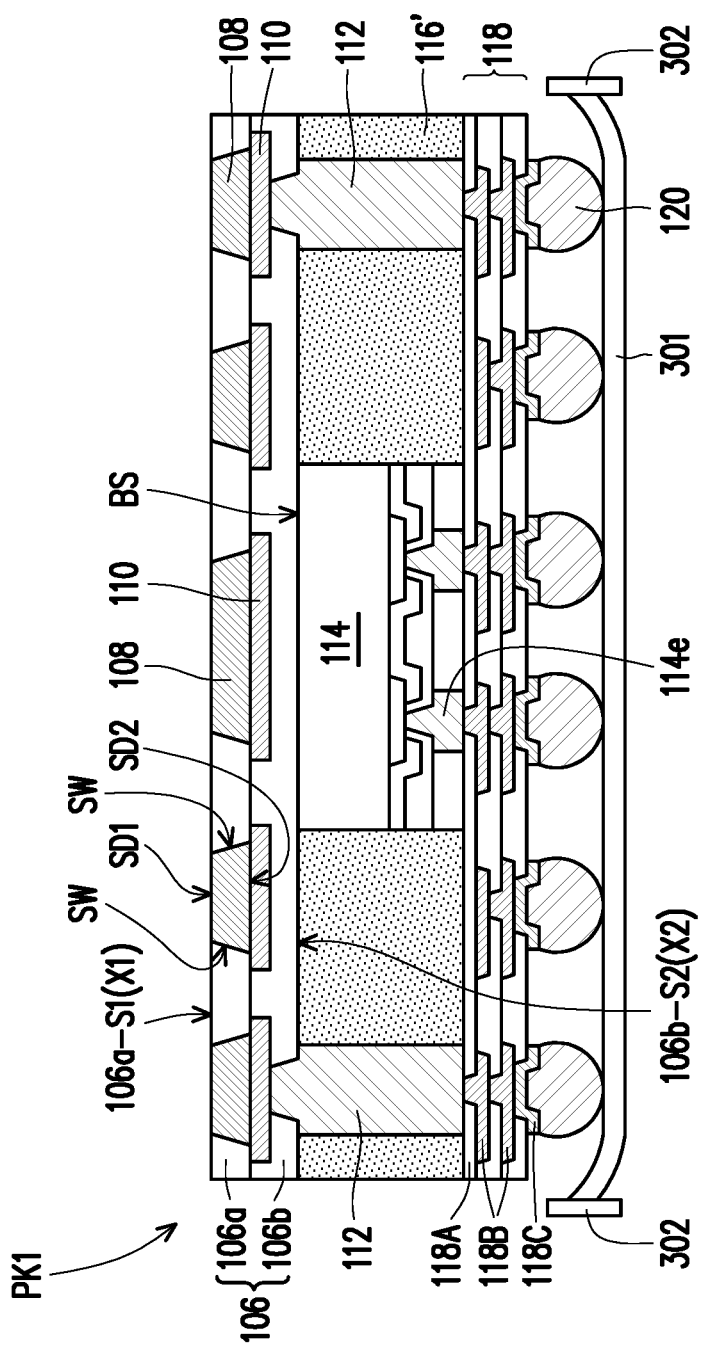

Referring to FIG. 1H, in some embodiments, after forming the second redistribution layer 118 and the conductive balls 120, the structure shown in FIG. 1G may be turned upside down and attached to a tape 301 supported by a frame 302. Subsequently, the carrier 102 may be de-bonded so as to separate the first redistribution layer 106 and the other elements formed thereon from the carrier 102. In the exemplary embodiment, the de-bonding process includes projecting a light such as a laser light or an UV light on the de-bonding layer 104 (e.g., the LTHC release layer), such that the carrier 102 can be easily removed. In certain embodiments, the de-bonding layer 104 may be further removed or peeled off to reveal the first side SD1 of the connecting portions 108, and to reveal the first surface 106a-S1 of the first dielectric layer 106a (or first surface X1 of the dielectric layer). Up to here, a first package PK1 according to some exemplary embodiments of the disclosure is accomplished. In the illustrated embodiment, the first side SD1 of the connecting portions 108 is revealed upon de-bonding of the carrier 102. Therefore, further connections to the first side SD1 of the connecting portions 108 can be sorted directly without the need of additional laser drilling/lithography processes.

Figure 1I:
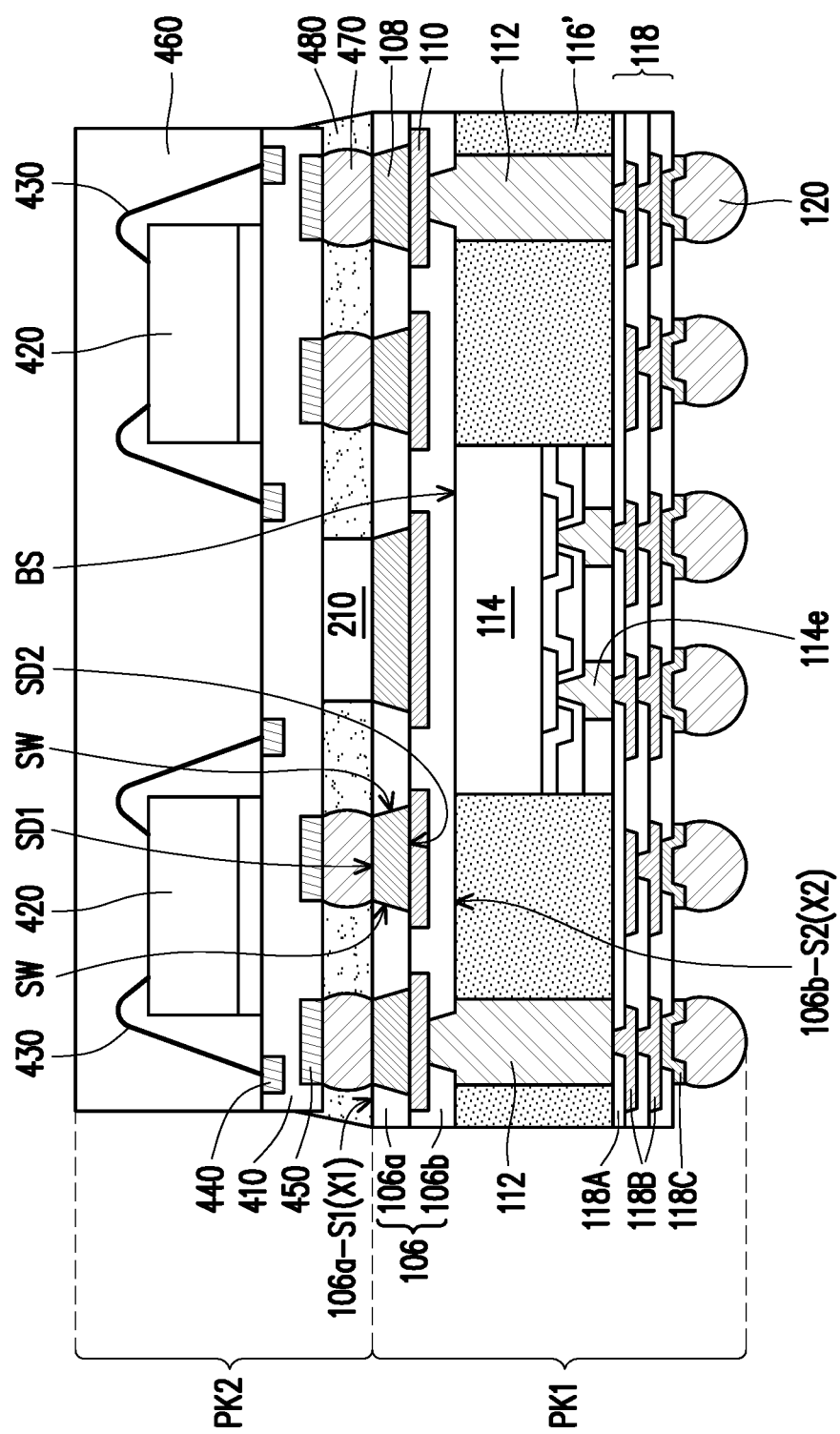

Referring to FIG. 1I, after forming the first package PK1, a second package PK2 is provided and stacked on the first package PK1. For example, the second package PK2 is electrically connected to the first side SD1 of the connecting portions 108 of the first package PK1. In the exemplary embodiment, the second package PK2 has a substrate 410, a plurality of semiconductor chips 420 mounted on one surface (e.g. top surface) of the substrate 410. In some embodiments, the semiconductor chips 420 are logic chips (e.g., central processing unit, microcontroller, etc.), memory chips (e.g., dynamic random access memory (DRAM) chip, static random access memory (SRAM) chip, etc.), power management chips (e.g., power management integrated circuit (PMIC) chip), radio frequency (RF) chips, sensor chips, signal processing chips (e.g., digital signal processing (DSP) chips), front-end chips (e.g., analog front-end (AFE) chips, the like, or a combination thereof. In one embodiment, both of the semiconductor chips 420 may, for example, be DRAM chips, but the disclosure is not limited thereto.

In some embodiments, bonding wires 430 are used to provide electrical connections between the semiconductor chips 420 and pads 440 (such as bonding pads). In some embodiments, an insulating encapsulant 460 is formed to encapsulate the semiconductor chips 420 and the bonding wires 430 to protect these components. In some embodiments, through insulator vias (not shown) may be used to provide electrical connection between the pads 440 and conductive pads 450 (such as bonding pads) that are located on another surface (e.g. bottom surface) of the substrate 410. In certain embodiments, the conductive pads 450 are electrically connected to the semiconductor chips 420 through these through insulator vias (not shown). In some embodiments, the conductive pads 450 of the second package PK2 are electrically connected to the connecting portions 108 of the first package PK1 through conductive balls 470. In certain embodiments, a silver paste 210 (conductive terminals) may be directly disposed on the first side SD1 of one of the connecting portions 108 so as to improve the heat dissipation of the package structure. In some embodiments, the silver paste 210 may be surrounded by the plurality of conductive balls 470. In some embodiments, an underfill 480 is further provided to fill in the spaces between the conductive balls 470 and the silver paste 210, so as to protect the conductive balls 470 and the silver paste 210. After stacking the second package PK2 on the first package PK1 and providing electrical connection therebetween, a package-on-package structure 100 according to some exemplary embodiments can be fabricated.

In the exemplary embodiment, the second package PK2 is a wire bond type package, however, the disclosure is not limited thereto. In alternative embodiments, the second package PK2 may be designed based on product requirement. For example, in certain embodiments, the second package PK2 may be a flip chip ball grid array (BGA) type package, or a fan-out wafer level package (WLP), the disclosure is not limited thereto.

Figure 2A:
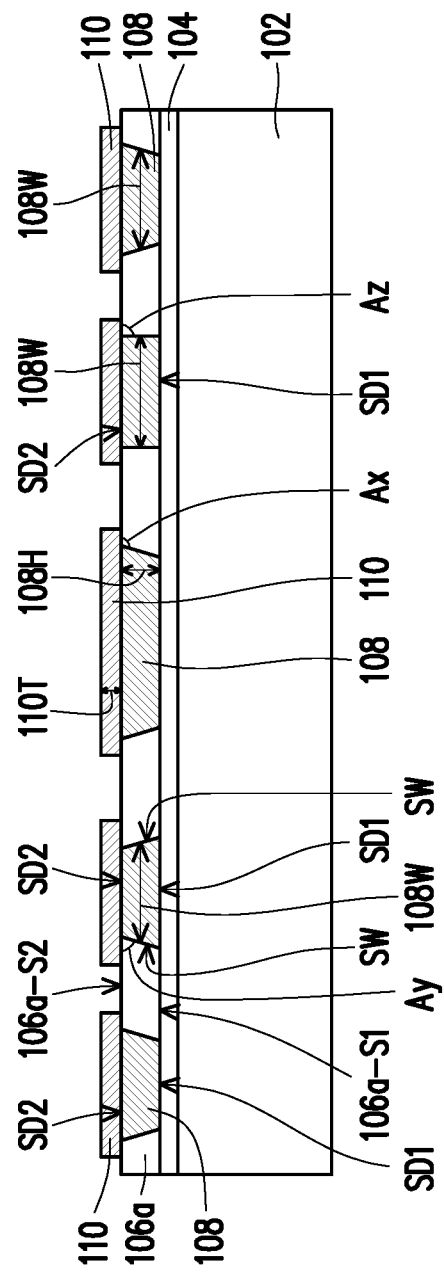
FIG. 2A is a schematic cross-sectional view of a stage in manufacturing a first redistribution layer according to some exemplary embodiments of the present disclosure.

FIG. 2A is a schematic cross-sectional view of a stage in manufacturing a first redistribution layer according to some exemplary embodiments of the present disclosure. In the above embodiments, the connecting portions 108 are designed such that the width 108W of the plurality of connecting portions 108 decreases from the first side SD1 to the second side SD2. However, the disclosure is not limited thereto. For example, as illustrated in FIG. 2A, some of the connecting portions 108 may be designed to have a width 108W that increases from the first side SD1 to the second side SD2 of the connecting portions 108. In other words, an angle Ay of the sidewalls SW of the connecting portions 108 relative to the conductive layer 110 is smaller than 90°. Furthermore, in some embodiments, some of the connecting portions 108 may be designed to have a width 108W that is kept constant from the first side SD1 to the second side SD2. That is, an angle Az of the sidewalls SW of the connecting portions 108 relative to the conductive layer 110 is approximately 90°.

Figure 2B:
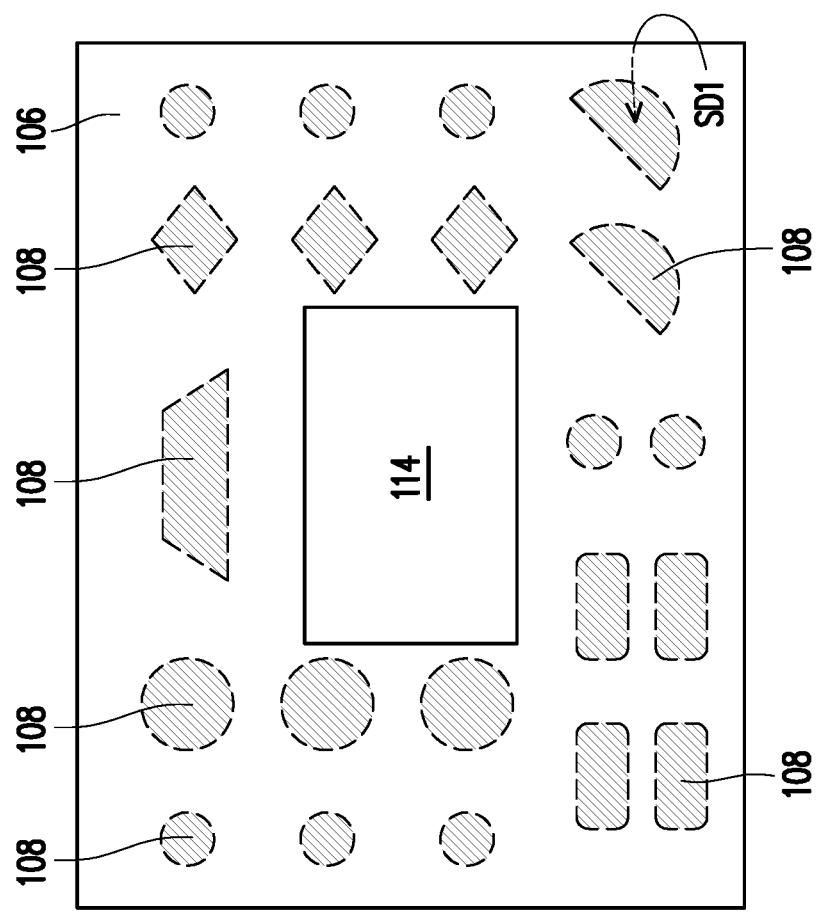
FIG. 2B is a schematic top view of a stage in manufacturing a package structure according to some exemplary embodiments of the present disclosure.

FIG. 2B is a schematic top view of a stage in manufacturing a package structure according to some exemplary embodiments of the present disclosure. FIG. 2B is the top view of the package structure after bonding a semiconductor die 114 onto the first redistribution layer 106, wherein the conductive layer 110 is omitted for illustrative purposes. As shown in FIG. 2B, the connecting portions 108 may be designed to have two or more different sizes (or shapes) so that the first side SD1 of the plurality of connecting portions 108 has different joint patterns (joint pads).

For example, in some embodiments, the connecting portions 108 may be designed to include two different sizes (shapes), so that the first side SD1 of the connecting portions 108 has two different joint patterns. In some embodiments, the connecting portions 108 may be designed to include three different sizes (shapes), so that the first side SD1 of the connecting portions 108 has three different joint patterns. In some embodiments, the connecting portions 108 may be designed to include four different sizes (shapes), so that the first side SD1 of the connecting portions 108 has four different joint patterns. In some embodiments, the connecting portions 108 may be designed to include five different sizes (shapes), so that the first side SD1 of the connecting portions 108 has five different joint patterns. In some embodiments, the connecting portions 108 may be designed to include six or more different sizes (shapes), so that the first side SD1 of the connecting portions 108 has six or more different joint patterns.

In the exemplary embodiment, the first side SD1 of the connecting portions 108 revealed from the first surface 106a-S1 of the first dielectric layer 106a (or first surface X1 of the dielectric layer) can be designed to have circular joint patterns, diamond-shaped joint patterns, semicircular joint patterns, trapezoidal-shaped joint patterns and squared-shaped joint patterns, each may be designed to have different sizes. However, the disclosure is not limited thereto, and the number of different joint patterns and design of the joint patterns of the connecting portions 108 may be altered based on product requirement.

Figure 3:
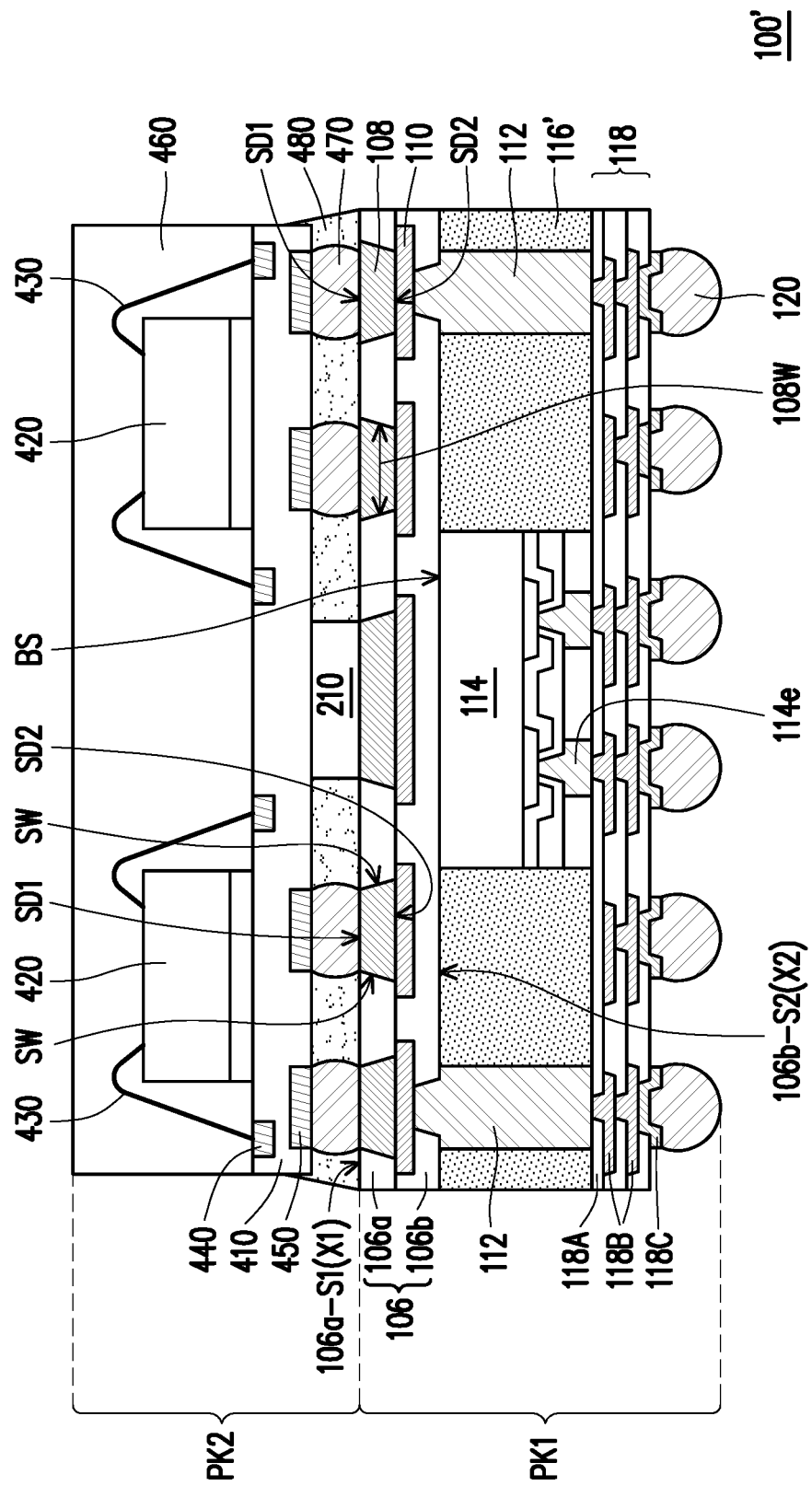
FIG. 3 is a schematic cross-sectional view of a package-on-package (PoP) structure according to some other embodiments of the present disclosure.

FIG. 3 is a schematic cross-sectional view of a package-on-package (PoP) structure according to some other embodiments of the present disclosure. The embodiment shown in FIG. 3 is similar to the embodiment shown in FIG. 1I, hence the same reference numerals are used to refer to the same or liked parts, and its detailed description will be omitted herein. The difference between the package-on-package structure 100 shown in FIG. 1I and the package-on-package structure 100' shown in FIG. 3 is in the design of the connecting portions 108. As illustrated in FIG. 3, a width 108W of a portion of the plurality of connecting portions 108 increases from the first side SD1 to the second side SD2, while a width 108W of a portion of the plurality of connecting portions 108 decreases from the first side SD1 to the second side SD2. That is, the connecting portions 108 of FIG. 3 is designed to include at least two different sizes (shapes), so that the first side SD1 of the connecting portions 108 has two different joint patterns.

Figure 4A:
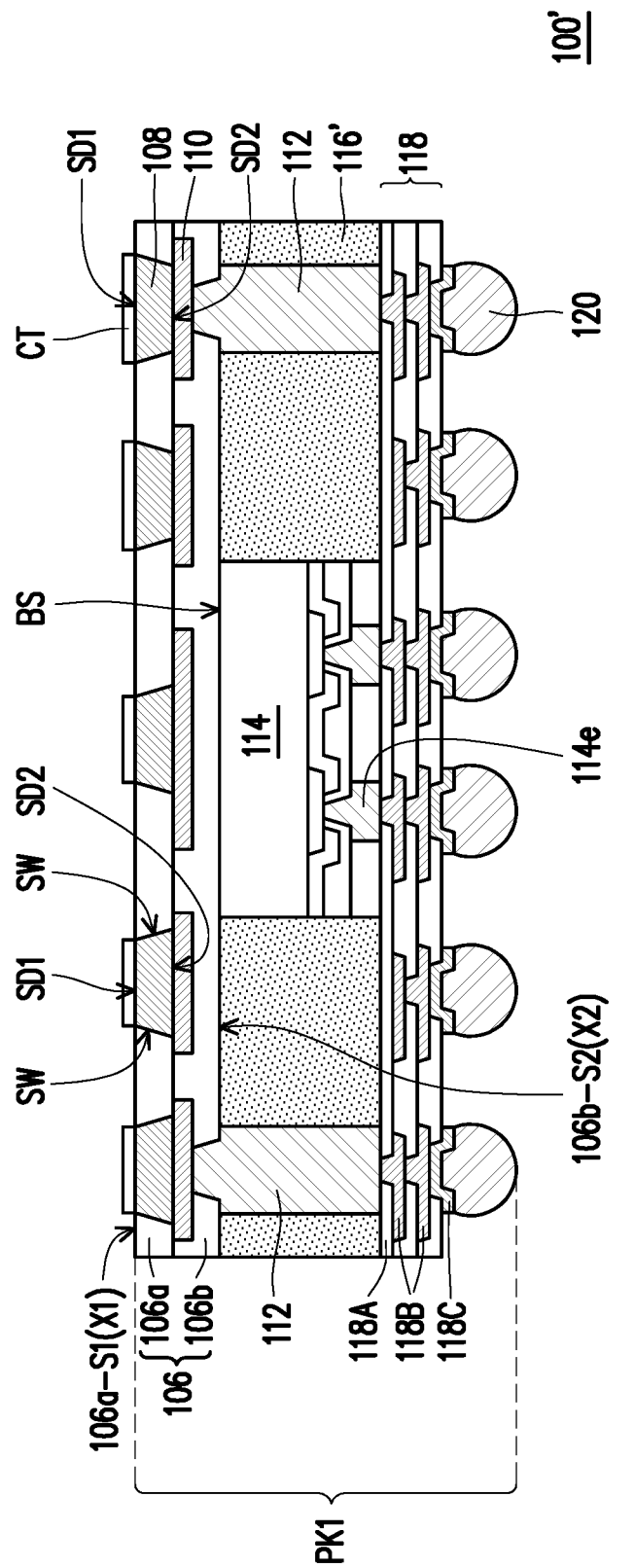
FIG. 4A is a schematic cross-sectional view of a package structure according to some other embodiments of the present disclosure.

FIG. 4A is a schematic cross-sectional view of a package structure according to some other embodiments of the present disclosure. In the above embodiments, the second package PK2 is directly disposed and connected to the first side SD1 of the connecting portions 108 of the first package PK1. However, the disclosure is not limited thereto. For example, as illustrated in FIG. 4A, a plurality of conductive terminals CT may be further disposed on the first side SD1 of the connecting portions 108 so as to form a first package PK1 with dual-side terminals. In some embodiments, the conductive terminals CT may be directly disposed/formed on the first side SD1 of the connecting portions 108 after de-bonding of the carrier (process shown in FIG. 1H). In certain embodiments, the conductive terminals CT are selected from the group consisting of an organic solder preservative (OSP), a nickel-gold coating (electroless nickel immersion gold; ENIG) and a titanium coating.

Figure 4B:
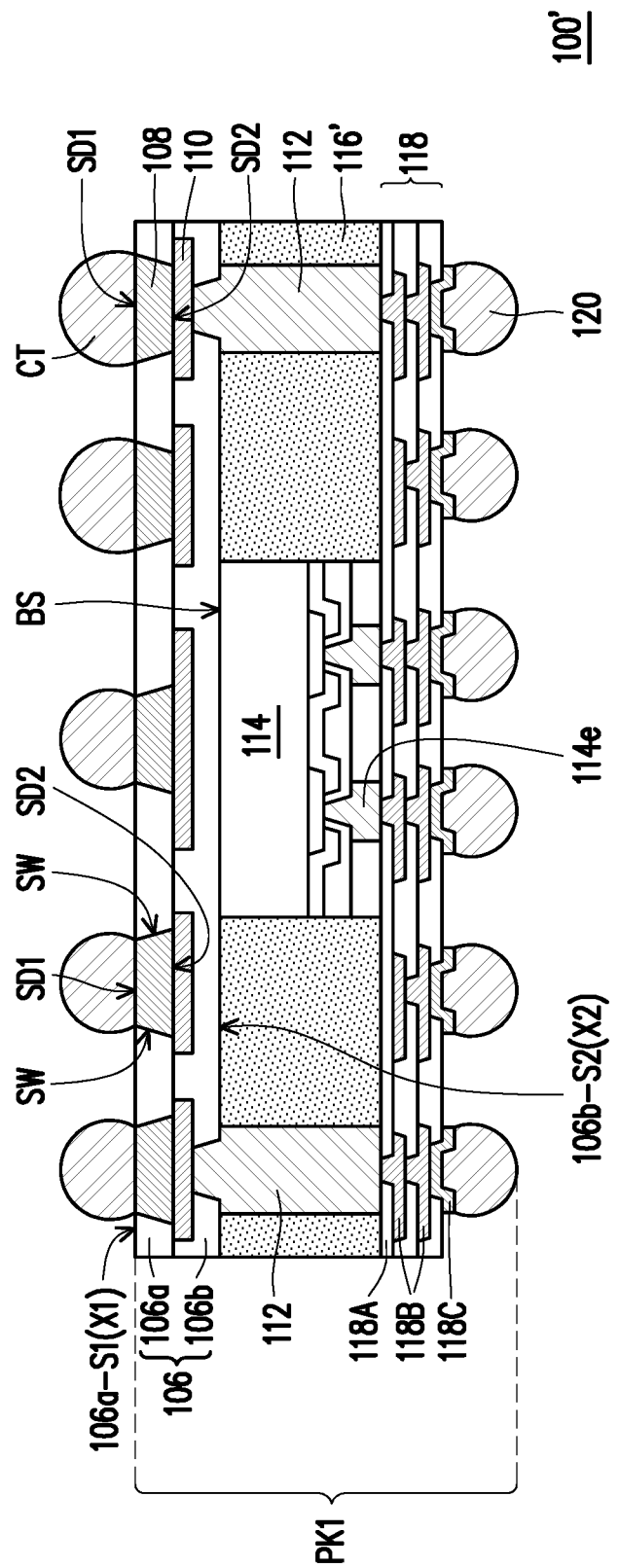
FIG. 4B is a schematic cross-sectional view of a package structure according to some other embodiments of the present disclosure.

FIG. 4B is a schematic cross-sectional view of a package structure according to some other embodiments of the present disclosure. The embodiment shown in FIG. 4B is similar to the embodiment shown in FIG. 4A, hence the same reference numerals are used to refer to the same or liked parts, and its detailed description will be omitted herein. The different between the embodiments of FIG. 4A and FIG. 4B is in the design of the conductive terminals CT. The conductive terminals CT shown in FIG. 4A are designed as a layer of coating disposed on the first side SD1 of the connecting portions 108. However, the disclosure is not limited thereto. As illustrated in FIG. 4B the conductive terminals CT are solder balls or solder paste that are disposed on the first side SD1 of the connecting portions 108 by a ball placement process or reflow process. In some alternative embodiments, the silver paste 210 used in FIG. 1I may be treated as the conductive terminals CT.

In the above embodiments, a first package is provided with a first redistribution layer having a plurality of connecting portions with a first side exposed from and coplanar with the first surface of the dielectric layer. As such, flat connection surfaces may be provided on the backside of the first package, and further connections to the first side of the connecting portions can be sorted directly without the need of additional laser drilling/lithography processes. This empowers versatile types of second package to join with the first package, without limitation in the design of the second package. In addition, with the design of the connecting portions joining the conductive layer, this increases the thickness of the metallization layers of conventional backside redistribution structures. Overall, a heat dissipation of the package structure can be improved, and better performance and lower costs can be achieved.

In some embodiments of the present disclosure, a package structure including a first redistribution layer, a semiconductor die, a plurality of through insulator vias, an insulating encapsulant and a second redistribution layer is provided. The first redistribution layer comprises a dielectric layer, a conductive layer embedded within the dielectric layer, and a plurality of connecting portions electrically connected to the conductive layer, wherein the dielectric layer has a first surface and a second surface opposite to the first surface, the plurality of connecting portions has a first side, a second side, and sidewalls joining the first side to the second side, the first side of the plurality of connecting portions is exposed from and coplanar with the first surface of the dielectric layer, and the second side of the plurality of connecting portions is connected to the conductive layer. The semiconductor die is disposed on the second surface of the dielectric layer over the first redistribution layer. The plurality of through insulator vias is connected to the conductive layer from the second surface of the dielectric layer, wherein the plurality of through insulator vias surround the semiconductor die. The insulating encapsulant is disposed on the second surface of the dielectric layer and encapsulating the semiconductor die and the plurality of through insulator vias. The second redistribution layer is disposed on the semiconductor die and over the insulating encapsulant, wherein the second redistribution layer is electrically connected to the semiconductor die and the plurality of through insulator vias.

In another embodiment of the present disclosure, a package-on-package structure including a first package and a second package is provided. The first package includes a first redistribution layer, a semiconductor die, a plurality of through insulator vias, an insulating encapsulant and a second redistribution layer. The first redistribution layer includes a first dielectric layer, a plurality of connecting portions embedded in the first dielectric layer, a second dielectric layer disposed on the first dielectric layer, and a conductive layer embedded within the second dielectric layer, wherein the plurality of connecting portions has a first side, a second side, and sidewalls joining the first side to the second side, the first side of the plurality of connecting portions is exposed from and coplanar with a first surface of the first dielectric layer, and the second side of the plurality of connecting portions is connected to the conductive layer. The semiconductor die is disposed on a second surface of the second dielectric layer over the first redistribution layer, the second surface being opposite to the first surface. The plurality of through insulator vias is connected to the conductive layer from the second surface of the second dielectric layer, wherein the plurality of through insulator vias surround the semiconductor die. The insulating encapsulant is disposed on the second surface of the second dielectric layer and encapsulating the semiconductor die and the plurality of through insulator vias. The second redistribution layer is disposed on the semiconductor die and over the insulating encapsulant, wherein the second redistribution layer is electrically connected to the semiconductor die and the plurality of through insulator vias. The second package is staked on the first package, wherein the second package is electrically connected to the first side of the plurality of connecting portions.

In yet another embodiment of the present disclosure, a method of fabricating a package-on-package structure is described. The method includes the following steps. A carrier is provided. A first redistribution layer is formed on the carrier, wherein the first redistribution layer is formed by the following steps. A first dielectric layer is formed on the carrier. A plurality of connecting portions is formed to be embedded in the first dielectric layer and a conductive layer is formed on the first dielectric layer connected to the plurality of connecting portions. The plurality of connecting portions has a first side, a second side, and sidewalls joining the first side to the second side, the first side of the plurality of connecting portions is exposed from and coplanar with a first surface of the first dielectric layer, and the second side of the plurality of connecting portions is connected to the conductive layer. A second dielectric layer is formed on the first dielectric layer and covering the conductive layer. A semiconductor die is bonded on the second surface of the second dielectric layer over the first redistribution layer, wherein the second surface is opposite to the first surface of first dielectric layer. A plurality of through insulator vias is formed on the conductive layer, wherein the plurality of through insulator vias is connected to the conductive layer from the second surface of the second dielectric layer and surrounding the semiconductor die. An insulating encapsulant is formed on the second surface of the second dielectric layer to encapsulate the semiconductor die and the plurality of through insulator vias. A second redistribution layer is formed on the semiconductor die and over the insulating encapsulant, wherein the second redistribution layer is electrically connected to the semiconductor die and the plurality of through insulator vias. The carrier is de-bonded to reveal the first side of the plurality of connecting portions. A second package is stacked on the first package, wherein the second package is electrically connected to the first side of the plurality of connecting portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
 a first redistribution layer, the first redistribution layer comprises a dielectric layer, a conductive layer embedded within the dielectric layer, and a plurality of connecting portions electrically connected to the conductive layer, wherein the dielectric layer has a first surface and a second surface opposite to the first surface, a first group of the plurality of connecting portions has a first side, a second side, and beveled sidewalls joining the first side to the second side, the first side of the first group of the plurality of connecting portions is exposed from and coplanar with the first surface of the dielectric layer, and the second side of the first group of the plurality of connecting portions is connected to the conductive layer, and at least one of the first group of the plurality of connecting portions has a width that increases from the first side to the second side, while another one of the first group of the plurality of connecting portions has a width that decreases from the first side to the second side;

a semiconductor die, disposed on the second surface of the dielectric layer over the first redistribution layer;

a plurality of through insulator vias connected to the conductive layer from the second surface of the dielectric layer, wherein the plurality of through insulator vias surround the semiconductor die;

an insulating encapsulant, disposed on the second surface of the dielectric layer and encapsulating the semiconductor die and the plurality of through insulator vias; and a second redistribution layer disposed on the semiconductor die and over the insulating encapsulant, wherein the second redistribution layer is electrically connected to the semiconductor die and the plurality of through insulator vias.

2. The package structure according to claim 1, wherein a thickness of the conductive layer and a height of the plurality of connecting portions sums up to a range of 14 μm to 35 μm.

3. The package structure according to claim 1, wherein a second group of the plurality of connecting portions has a first side, a second side, and sidewalls joining the first side to the second side, and the first side of the second group of the plurality of connecting portions is exposed from and coplanar with the first surface of the dielectric layer, and the second side of the second group of the plurality of connecting portions is connected to the conductive layer, and an angle of the sidewalls relative to the conductive layer is approximately 90°.

4. The package structure according to claim 1, wherein the plurality of connecting portions comprises two or more different sizes so that the first side of the plurality of connecting portions has different joint patterns.

5. The package structure according to claim 1, further comprising a plurality of conductive terminals disposed on the first side of the plurality of connecting portions.

6. The package structure according to claim 5, wherein the conductive terminals are selected from the group consisting of a solder ball, an organic solder preservative, a nickel-gold coating, a titanium coating and a silver paste.

7. The package structure according to claim 1, wherein the first side of the first group of the plurality of connecting portions comprises two or more different shapes, including at least one circular joint pattern and at least one squared-shaped joint pattern.

8. The package structure according to claim 7, wherein the first side of the first group of the plurality of connecting portions comprises circular joint patterns, diamond-shaped joint patterns, semicircular joint patterns, trapezoidal-shaped joint patterns and squared-shaped joint patterns.

9. A package-on-package structure, comprising:
a first package, the first package comprises:
a first redistribution layer, the first redistribution layer comprises a first dielectric layer, a plurality of connecting portions embedded in the first dielectric layer, a second dielectric layer disposed on the first dielectric layer, and a conductive layer embedded within the second dielectric layer, wherein the plurality of connecting portions has a first side, a second side, and sidewalls joining the first side to the second side, the first side of the plurality of connecting portions is exposed from and coplanar with a first surface of the first dielectric layer, and the second side of the plurality of connecting portions is connected to the conductive layer;

a semiconductor die, disposed on a second surface of the second dielectric layer over the first redistribution layer, the second surface being opposite to the first surface;

a plurality of through insulator vias connected to the conductive layer from the second surface of the second dielectric layer, wherein the plurality of through insulator vias surround the semiconductor die;

an insulating encapsulant, disposed on the second surface of the second dielectric layer and encapsulating the semiconductor die and the plurality of through insulator vias; and a second redistribution layer disposed on the semiconductor die and over the insulating encapsulant, wherein the second redistribution layer is electrically connected to the semiconductor die and the plurality of through insulator vias;

a second package stacked on the first package, wherein the second package is electrically connected to the first side of the plurality of connecting portions through a plurality of conductive balls; and an underfill disposed on the first dielectric layer and surrounding the plurality of conductive balls, wherein an interface between the underfill and the first dielectric layer is aligned with an interface between the plurality of conductive balls and the first side of the plurality of connecting portions.

10. The package-on-package structure according to claim 9, wherein a thickness of the conductive layer and a height of the plurality of connecting portions sums up to a range of 14 μm to 35 μm.

11. The package-on-package structure according to claim 9, further comprising a silver paste disposed on the first side of one of the connecting portions in between the first package and the second package, wherein a plurality of conductive balls of the second package surrounds the silver paste.

12. The package-on-package structure according to claim 9, wherein the plurality of connecting portions comprises two or more different sizes so that the first side of the plurality of connecting portions has different joint patterns.

13. The package-on-package structure according to claim 9, wherein a width of a portion of the plurality of connecting portions increases from the first side to the second side.

14. The package-on-package structure according to claim 9, wherein a width of a portion of the plurality of connecting portions decreases from the first side to the second side.

15. The package-on-package structure according to claim 9, further comprising a silver paste disposed on the first side of the plurality of connecting portions, wherein the interface between the underfill and the first dielectric layer is further aligned with an interface between the silver paste and the first side of the plurality of connecting portions.

16. A method of fabricating a package-on-package structure, comprising:
forming a first package, comprising:
providing a carrier;
forming a first redistribution layer on the carrier, wherein the steps of forming the first redistribution layer comprises:
forming a first dielectric layer on the carrier;
forming a plurality of connecting portions embedded in the first dielectric layer and forming a conductive layer on the first dielectric layer connected to the plurality of connecting portions, wherein the plurality of connecting portions has a first side, a second side, and sidewalls joining the first side to the second side, the first side of the plurality of connecting portions is exposed from and coplanar with a first surface of the first dielectric layer, and the second side of the plurality of connecting portions is connected to the conductive layer; and forming a second dielectric layer on the first dielectric layer and covering the conductive layer;

bonding a semiconductor die on a second surface of the second dielectric layer over the first redistribution layer, wherein the second surface is opposite to the first surface of first dielectric layer;

forming a plurality of through insulator vias on the conductive layer, wherein the plurality of through insulator vias is connected to the conductive layer from the second surface of the second dielectric layer and surrounding the semiconductor die;

forming an insulating encapsulant on the second surface of the second dielectric layer to encapsulate the semiconductor die and the plurality of through insulator vias; and forming a second redistribution layer on the semiconductor die and over the insulating encapsulant, wherein the second redistribution layer is electrically connected to the semiconductor die and the plurality of through insulator vias;

de-bonding the carrier to reveal the first side of the plurality of connecting portions of the first package;

stacking a second package on the first package, wherein the second package is electrically connected to the first side of the plurality of connecting portions through a plurality of conductive balls; and forming an underfill on the first dielectric layer of the first package and surrounding the plurality of conductive balls, wherein an interface between the underfill and the first dielectric layer is aligned with an interface between the plurality of conductive balls and the first side of the plurality of connecting portions.

17. The method of fabricating a package-on-package structure according to claim 16, further comprising:

forming a silver paste on the first side of the plurality of connecting portions prior to forming the underfill, wherein the interface between the underfill and the first dielectric layer is further aligned with an interface between the silver paste and the first side of the plurality of connecting portions.

18. The method of fabricating a package-on-package structure according to claim 16, wherein the plurality of connecting portions is formed with two or more different sizes so that the first side of the plurality of connecting portions has different joint patterns.

19. The method of fabricating a package-on-package structure according to claim 16, wherein a width of the plurality of connecting portions increases from the first side to the second side, or a width of the plurality of connecting portions decreases from the first side to the second side.

20. The method of fabricating a package-on-package structure according to claim 16, wherein the conductive layer and the plurality of connecting portions are formed in different steps.

\* \* \* \* \*